(12) United States Patent
Gates et al.

(10) Patent No.: US 6,203,613 B1
(45) Date of Patent: Mar. 20, 2001

(54) ATOMIC LAYER DEPOSITION WITH NITRATE CONTAINING PRECURSORS

(75) Inventors: Stephen McConnell Gates, Ossining, NY (US); Deborah Ann Neumayer, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/421,096

(22) Filed: Oct. 19, 1999

(51) Int. Cl.$^7$ ................................................. C30B 25/14
(52) U.S. Cl. ........................... 117/104; 117/84; 117/102; 117/89; 117/952
(58) Field of Search ............................... 117/84, 104, 89, 117/952

(56) References Cited

U.S. PATENT DOCUMENTS

| | | |
|---|---|---|
| 4,058,430 | 11/1977 | Suntola et al. |
| 4,861,417 | 8/1989 | Mochizuki et al. |
| 5,166,092 | 11/1992 | Mochizuki et al. |
| 5,256,244 | 10/1993 | Ackerman. |

OTHER PUBLICATIONS

D.G. Colombo, et al., "Anhydrous Metal Nitrates as Volatile Single Source Precursors for the CVD of Metal Oxide Films," Chem. Vap. Deposition, vol. 4, No. 6, pp. 220–222 (1998).

D.C. Gilmer, et al., "Low Temperature CVD of Crystalline Titanium Dioxide Films Using Tetranitratotitanium (IV) **," Chem. Vap. Deposition, vol. 4, No. 1, pp. 9–11, (1998).

C.J. Taylor, et al., "Does Chemistry Really Matter in the Chemical Vapor Deposition of Titanium Dioxide? Precursor and Kinetic Effects on the Microstructure of Polycrystalline Films," J. Am. Chem. Soc., vol. 121, pp. 5220–5229 (1999).

*Primary Examiner*—Robert Kunemund
(74) *Attorney, Agent, or Firm*—Scully, Scott, Murphy & Presser; Robert M. Trepp, Esq.

(57) ABSTRACT

Metal nitrate-containing precursor compounds are employed in atomic layer deposition processes to form metal-containing films, e.g. metal, metal oxide, and metal nitride, which films exhibit an atomically abrupt interface and an excellent uniformity.

53 Claims, 1 Drawing Sheet

ATOMIC LAYER DEPOSITION WITH NITRATE CONTAINING PRECURSORS

FIELD OF THE INVENTION

The present invention relates to metal nitrate-containing precursor compounds for use in atomic layer deposition (ALD) in forming metal-containing films (elemental metal, metal oxide or metal nitride) which may be used in numerous semiconductor applications, including as a gate dielectric for a semiconductor transistor, as a capacitor dielectric in memory circuits, as a reaction diffusion barrier and other like applications. Specifically, the present invention employs a metal nitrate-containing compound as a precursor compound for atomic layer deposition providing metal-containing films that have the following advantages: atomically abrupt interfaces, fine thickness control (to about 1 monolayer), and excellent uniformity. Metal nitrate-containing precursors include nitrates, oxo-nitrates, and substituted nitrate complexes.

BACKGROUND OF THE INVENTION

Atomic layer epitaxy (ALE) of metal oxides traditionally reacts a metal chloride precursor such as $TiCl_4$ with water to form a metal oxide layer. One such method is described, for example, in "Atomic Layer Epitaxy", by T. Suntola & M. Simpson (Chapman & Hall, 1990, New York, N.Y. U.S. Pat. No. 5,256,244 to Ackerman discloses the use of a hydrolyzable chloride of a metal and water to deposit a metal oxide film by ALE.

These prior art methods suffer from the disadvantage of residual chlorine being retained in the oxide film as well as possible formation of chlorides. As is well known to those skilled in the art, chlorine and chlorides are not desirable in electronic devices. This is because the resultant metal oxide formed from metal chloride precursors will be slightly conductive (high leakage current) due to ionic $Cl^-$ conduction. Moreover, chlorine can diffuse out of the metal oxide and adversely affect other regions of the electronic device.

U.S. Pat. No. 4,058,430 to Suntola discloses the use of a single vapor element reacted with a substance to form a film. This method suffers the following disadvantages: the need to physically evaporate the element; the low volatility of some elements and; in the case of metal oxide films, a need to oxidize the element.

U.S. Pat. No. 4,861,417 to Mochizuki, et al. discloses the use of an alkyl aluminum precursor such as trimethylaluminum or triethylaluminum as the source material for the growth of III–V compound semiconductors by ALE. U.S. Pat. No. 5,166,092 to Mochizuki, et al., on the other hand, discloses the use of different polarites and source compounds containing at least one methyl group for the growth of III–V compound semiconductors by ALE. These two prior art methods suffer from the disadvantage that residual carbon may be into the films resulting from incomplete decomposition of the alkylated aluminum precursors. Moreover, carbon is not desirable because it can make the metal oxide slightly conductive, and carbon can also diffuse out of the metal oxide and adversely affect other regions of the electronic device.

Another technique that is commonly employed in forming metal films is Molecular Beam Epitaxy (MBE). MBE traditionally uses an evaporated metal as a source material. Variations of MBE include gas source MBE, organometallic MBE, metal organic MBE and chemical beam epitaxy which typically utilize metal carbonates, alkoxides, β-diketonates or halides as the source material.

Anhydrous volatile metal nitrates without the use of oxidizing co-reactants have been described as precursors for chemical vapor deposition (CVD) of metal oxide films, see W. L. Gladfelter, et al. "Anhydrous Metal Nitrates as Volatile Single Source Precursors for the CVD of Metal Oxide Films", Chem. Vap. Dep. 1998, 4, No. 6, p.220 and references cited therein. The use of metal nitrate precursors in CVD applications is also disclosed in W.L Gladfelter, et al., "Low Temperature CVD of Crystalline Titanium Dioxide Films Using Tetranitratotitanium(iv)", Chem. Vap. Dep. 1998, 4, No. 1, p.9 and W. L Gladfelter, et al. "Does Chemistry Really Matter in the Chemical Vapor Deposition of Titanium Dioxide? Precursor and Kinetic Effects on the Microstructure of Polycrystalline Films", JACS, 1999, 121, p.5220. Each of these references disclose that metal nitrate-containing precursors can be used in forming oxide films by CVD without the use of an oxidizing co-reactant. There is no disclosure in these references however of using the nitrate-containing precursors in ALD applications with oxidizing, nitriding or reducing co-reactants.

The present invention differs from the above cited references in that metal nitrate-containing precursors are used in conjunction with oxidizing, nitriding and reducing co-reactants to grow oxide, nitride and metal films, respectively by ALD.

In the above cited references, metal oxide films are grown by CVD without an oxidizing co-reactant. This is necessary because, as described in the references, the metal nitrate-containing precursors are powerful oxidizing and nitrating agents, capable of reacting vigorously with many compounds. In addition, the metal nitrate precursors readily decompose in the presence of ambient air, water, light and/or at temperatures as low as 100° C. The reactivity of the metal nitrates makes gas phase reactions with other precursors, and with co-reactants such as oxidizing, nitriding and reducing agents likely. The gas phase reactions can lead to premature decomposition of the metal nitrate precursor, and of the co-reactants, potentially resulting in particle formation in the gas phase, reduced incorporation of reactants into the film, difficulty in reproducibility of film stoichiometry, thickness and uniformity across the wafer and contamination of delivery lines and CVD chamber due to uncontrolled decomposition. For example to form a nitride film, it is necessary to introduce a nitriding reagent such as ammonia into the gas stream. Ammonia can react with the metal nitrate precursor in the gas phase leading to premature decomposition in the gas phase and poor growth properties.

As described above, use of metal nitrates in a conventional CVD system has significant problems that may prevent success. However, use of the metal nitrate-containing precursors using ALD techniques would avoid the difficulties listed above. By alternating reactants in the gas stream, the opportunity for gas reactions is minimized allowing the use of metal nitrates with incompatible reagents such as oxidizing, nitriding, reducing agents, and other metal-containing precursors to form multicomponent metal oxide, metal nitride and metal films which can not be made by conventional CVD.

ALD differs from CVD and therefore has different precursor requirements than CVD. ALD is performed in a cyclic fashion with sequential alternating pulses of precursor, reactant and purge gas. The ALD precursor must have a self-limiting effect such that the precursor is adsorbed on the substrate up to monolayer. Because of the self-limiting effect, only one monolayer or sub-monolayer is deposited per operation cycle, and additional precursor will not be deposited on the grown layer even when excess precursor is supplied. In CVD, precursor and reactants arrive at the substrate simultaneously with film growth resulting from continuous chemical reactions of precursors on the substrate surface. Uniform and reproducible growth of the film is dependent on maintenance of the correct precursor and reactant flux at the substrate. The growth rate is proportional to the precursor flux at the substrate and to the substrate temperature. Because of the different growth mechanisms, the precursor requirements differ for ALD and CVD. In ALD, the precursor must readily adsorb at bonding sites on the growth surface in a self-limiting mode, and once adsorbed must readily react with co-reactant to form the desired film. In CVD, the precursor and the co-reactants must react appropriately at the substrate surface simultaneously to form the desired film. Thus, many useful CVD precursors are not viable as ALD precursors, and it is not trivial or obvious to select a precursor for the ALD method.

SUMMARY OF THE INVENTION

One object of the present invention is to provide an atomic layer deposition (ALD) process using a metal nitrate-containing precursor and an oxidizing agent to deposit a metal oxide film which is useful as a gate dielectric or a capacitor dielectric or a reaction barrier layer in integrated circuits.

Another object of the present invention is to provide an ALD process using a metal nitrate-containing precursor and a reducing agent to deposit a highly conformal metal film which is useful as a wiring layer or conductive barrier layer in wiring interconnect structures, such as copper interconnects used in high speed microprocessors.

A still further object of the present invention is to provide an ALD process using a metal nitrate-containing precursor and a nitriding agent to deposit a highly conformal metal nitride film which is useful as a barrier layer in wiring interconnect structures, such as copper interconnects used in high speed microprocessors. Metal nitride layers may also be used in optical semiconductor devices.

A still further object of the present invention is to provide an ALD process using a metal nitrate-containing precursor and a metal non-nitrate containing precursor (selected from the group consisting of metal alkyls, metal halides, metal β-diketonates, metal alkoxides, metal hydrides, metal silyls and metal amides) and an oxidizing agent to deposit a multicomponent or multilayer metal oxide film.

A still further object of the present invention is to provide an ALD process using a metal nitrate-containing precursor and a metal non-nitrate containing precursor (selected from the group consisting of metal alkyls, metal halides, metal β-diketonates, metal alkoxides, metal hydrides, metal silyls and metal amides) and a reducing agent to deposit a multicomponent or multilayer highly conformal metal film.

A still further object of the present invention is to provide an ALD process using a metal nitrate-containing precursor and a metal non-nitrate containing precursor (selected from the group consisting of metal alkyls, metal halides, metal β-diketonates, metal alkoxides, metal hydrides, metal silyls and metal amides) and a nitriding agent to deposit a multicomponent or multilayer highly conformal metal nitride film.

A yet further object of the present invention is to provide an ALD process using a metal nitrate-containing precursor to form a complex multilayer structure which contains alternating films of metal oxides, metal nitrides and metals in any combination.

Other objects of the present invention include:

to demonstrate the fabrication process of transistor structures that contain an oxide gate dielectric deposited by an ALD process using a metal nitrate-containing precursor.

to demonstrate the fabrication process of capacitor structures that contain an inorganic capacitor dielectric deposited by an ALD process using a metal nitrate-containing precursor.

to demonstrate the fabrication process of multilayer structures with alternating layers of metal oxide, metal and metal nitrides in various combinations which have optical applications such as dielectric mirrors or anti-reflection coatings deposited by an ALD process using a metal nitrate-containing precursor.

It is noted that the term "atomic layer deposition (ALD)" is used in the present application to include atomic layer epitaxy as well as molecular beam epitaxy (MBE), gas source MBE, organometallic MBE and chemical beam epitaxy when performed with alternating pulses of precursor, co-reactant and purge gas.

Metal oxide films formed by ALD are advantageous for use as gate dielectrics in field effect transistors (FETs) having small features size (less than 150 nm) due to the possibility of generating atomically abrupt interfaces and controlling the dielectric thickness in the 1–10 nm range, with a precision of 0.1 nm. ALD methods are easily implemented to deposit uniform films on Si wafer substrates 200 and 300 nm in diameter. Other applications include, but are not limited to: capacitors in dynamic random access memory circuits, reaction diffusion barriers, insulators, decoupling capacitors and wear resistant coatings.

As stated above, previous ALD methods for metal oxide formation use the reaction of metal chlorides with water to form metal oxides. These prior art ALD methods suffer from the disadvantage of residual chlorine being retained in the films or the formation of oxychlorides. By using the method of the present invention, these disadvantages will be obviated.

The present invention describes the use of metal nitrate-containing precursors, $M(NO_3)_x$ to form metal-containing films by any ALD method. The term "metal-containing films" includes metal oxides, metal nitrides, elemental metal or any combination or mixtures thereof including multilayers and multicomponent. The precursors of the present invention are used with a co-reactant gas such as an oxidizing agent, a reducing agent or a nitriding agent in forming metal-containing films by ALD. In the above formula, M is a metal selected from the group consisting of Ti, Ga, Zr, Sn, Co, V, Cr, Hf, Cu, Mn, La, Y, Al, Gd, Nd, Sm, Si, Nb, Ta and In; and x is the valence state of M.

The precursors of the present invention may also be used with metal non-nitrate containing precursors and co-reactant gases to grow multicomponent or multilayer metal-containing films by ALD.

In addition to employing metal nitrates in which all the ligands are $NO_3$ ligands, it is also within the contemplation of the present invention to replace some, but not all, of the $NO_3$ ligands with a substituent R, wherein R is hydrogen, oxygen, oxynitrates such as $N_2O_5$ or $NO_2$, hydroxyl, aromatic, amine, alkyl, silyl, alkoxide, β-diketone or mixtures thereof. In many metal oxide applications, nitrogen incorporation (oxynitride) may be beneficial, yielding superior dielectric properties.

The advantage of using metal nitrate-containing precursors in ALD processes is that a byproduct of the reaction is $NO_x$ molecule which, if incorporated in the film and thermally decomposed, will form an oxynitride or nitride species that is not ionically conductive. By substituting other ligands such as hydrogen, oxygen, oxynitrates such as $N_2O_5$ or $NO_2$, hydroxyl, aromatic, amine, alkyl, silyl, alkoxide or β-diketone for a nitrate ligand, tailored chemical properties of the precursor such as volatility, and chemical thermal stability can be obtained. By avoiding halide containing precursors, the present invention solves the problem of chlorine contamination. Any residual nitrate in the metal film can potentially be converted to either a volatile $NO_x$ species or to an insulative oxynitride or nitride which would not be electrically conductive.

Thus the present invention provides a route to metal-containing film deposition, and the films of this invention may have superior electrical properties compared to chlorine contaminated metal-containing films.

Metal nitride films formed by the present invention are advantageous for use as diffusion/reaction barrier layers in thin film wiring interconnect structures because the present invention can control the metal nitride thickness in the 1–10 nm range, with a precision of 0.1 nm. Also, the conformality of ALD nitride films inside small vias (100–300 nm diameter) and trenches is excellent (nearly 100% step coverage).

The metal nitrate-containing precursors of the present invention are also uniquely suited for MBE which shares a similar layer by layer growth mechanism as ALD. MBE of metal oxides traditionally uses metal sources and typically results in a nonstoichiometric oxide film. The present invention solves this problem by replacing the low reactivity metals (often difficult to oxidize metals) with pre-oxidized, more reactive metal nitrate-containing precursors. The nitrate ligands of the precursor compounds of the present invention may be readily replaced by an oxygen-containing species, or the nitrates may decompose and provide oxygen atoms to the metal films.

The metal oxides of the present invention typically have dielectric constants of from about 10 to about 100, which are much higher than that of $SiO_2$. The FETs of the present invention, which use the metal oxides made by ALD, have increased gate dielectric thickness compared to $SiO_2$ and hence lower gate leakage current and improved reliability compared to FETs having $SiO_2$ gate dielectrics.

DETAILED DESCRIPTION OF THE INVENTION

Figure 1A:
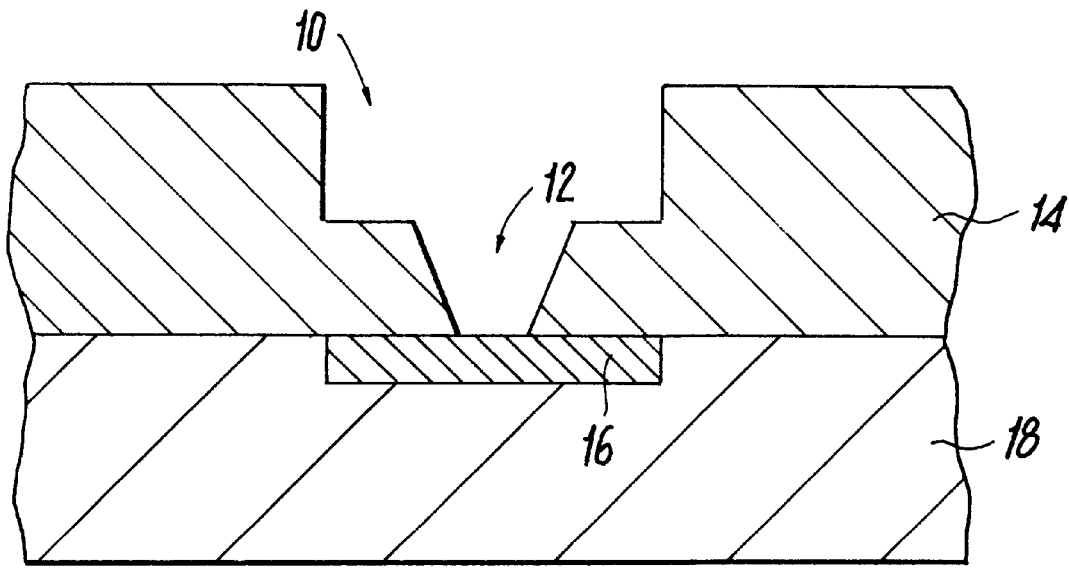
FIGS. 1A–B are cross-sectional views illustrating a thin film wiring structure in which the ALD method of the present invention is utilized in forming a metal nitride barrier that conformally coats the etched features of a dual damascene structure.

As stated above, the present invention provides precursor compounds that are employed in ALD processes, including MBE, gas source MBE, organometallic MBE, chemical beam epitaxy and other like deposition. processes in which alternating pulses of precursor and co-reactant are performed. Specifically, the precursor compounds of the present invention comprise a metal nitrate-containing compound having the formula $M(NO_3)_x$ wherein M is a metal selected from the group consisting of Ti, Ga, Zr, Sn, Co, V, Pt, Pd, Fe, Ni, Mo, W, Ag, Au, Hf, Cr, Cu, Mn, La, Y, Al, Gd, Nd, Sm, Si, Nb, Ta and In; and x is the valency of M.

In one embodiment of the present invention some, but not all of the $NO_3$ ligands are replaced by a substituent R, wherein substituent R is selected from the group consisting of hydrogen, oxygen, oxynitrates such as $N_2O_5$ or $NO_2$, hydroxyl, aromatic, alkyl, amine, silyl, alkoxide or β-diketone. Combinations of said R substituents are also contemplated herein.

The metal precursor compounds of the present invention are used in conventional ALD processes or related atomic deposition processes such as MBE and are used in place of metal chloride precursors. As is known to those skilled in the art, ALD processes form a metal-containing film using alternating pulses of at least one reactant (i.e. precursor) and a purge gas.

In one embodiment of the present invention, a co-reactant is employed with the metal precursor compound. In that embodiment of the present invention, the pulse sequence could be:

metal precursor inert purge co-reactant inert purge

In an alternative embodiment, two or more metal precursor compounds may be employed. The pulse sequence in that instance would be:

1st metal precursor inert purge co-reactant inert purge

2nd metal precursor inert purge co-reactant inert purge.

In an alternative embodiment, two or more metal precursor compounds may be employed with the proviso that at least one of the metal precursors is a metal nitrate-containing precursor. The other metal precursor may be a metal non-nitrate containing precursor.

Other pulse sequences can also be employed in the present invention so long as the reactants are pulsed separatedly onto the substrate so that there is a sequential build-up of the film on the substrate. For example the pulse sequence could be co-reactant, inert purge, precursor, and inert purge.

The co-reactants employed in the present invention are conventional oxidizing agents, nitriding agents and reducing agents that are typically employed in ALD processes.

Suitable oxidizing agents include, but are not limited to: oxygen, ozone, water, hydrogen peroxide, nitrous oxide or any other oxidizing agents or combinations thereof.

Suitable reducing agents that can be employed in the present invention include: hydrogen, forming gas or any other reductants or combinations thereof.

Suitable nitriding agents that may be employed in the present invention include, but are not limited to: ammonia, hydrazine, tertbutylamine, isopropylamine, hydrogen azide or any other nitriding agent or combinations thereof.

Suitable metal non-nitrate containing precursors include, but are not limited to: metal alkyls, metal halides, metal β-diketonates, metal alkoxides, metal hydrides, metal silyls, metal amides or any other metal non-nitrate containing precursor or combinations thereof.

As stated above, the precursor compounds of the present invention are used in ALD processes wherein sequential deposition of each reactant occurs. In ALD processes, the precursor and the co-reactant are not required to react together as is the case in CVD processes. Instead, each reactant is pulsed sequentially onto a suitable substrate typically at lower deposition temperatures than presently used in CVD.

In the present invention, the deposition temperature may vary depending on the precursor compound and the co-reactant used, but typically it is less than 400° C. (CVD deposition, on the other hand, is typically above 500° C.). A preferred deposition temperature employed in the present invention is from about 200° to about 400° C.

As stated above, ALD comprises sequential deposition of precursor, purge gas and co-reactant. The inert gas purge separates the various reactant pulses. The inert gases employed in the present invention include the use of inert gases such as He, Ar, $N_2$ and other like gases. The pulse duration of precursor, co-reactant and inert gas is not critical to the present invention, but typically, the pulse duration is from 0.1 to about 5 seconds, with from 0.2 to about 1 second being highly preferred. It is noted that the pulse duration of precursor and the co-reactant is typically less than that of the inert gas purge.

In the present invention, a complete series of pulses (precursor/inert purge/co-reactant/inert purge) is referred to herein as a cycle. The completion of one cycle results in the deposition of from about 0.01 to about 1 monolayer of metal-containing film on the surface of the substrate. The above monolayer range corresponds to a film thickness of from about 0.02 to about 1 nm. To achieve a desired thickness, the cycle may be repeated any number of times.

Suitable substrates in which the precursor compounds of the present invention may be pulsed onto include, but are not limited to semiconductor substrates, dielectrics, metal layers, organic substrates, glasses, metal oxides and plastic polymeric substrates. The term semiconductor substrate includes Si-containing semiconductor substrates, silicon-on-insulator substrates, Ge substrates, SiGe substrates, GaAs substrates and other like semiconductor substrates. Layered substrates such as Si and SiGe are also contemplated in the present invention.

The following examples are given to illustrate some of the advantages that can be obtained from the present invention as well as indicating other areas in which the present invention can be expanded to.

EXAMPLE 1

In this example, the method of the present invention was employed in fabricating a gate dielectric of an FET. Specifically, in this example, a Si wafer substrate containing patterned structures was employed. Selected regions of the substrate contain shallow trench isolation (STI) oxide located between the sites of the FET, other regions contain the field oxide, and selected regions of bare Si are exposed in the regions where the FET is to be located.

The Si wafer substrate was then placed in a suitable reactor for atomic layer deposition, for example a commercial F-200 reactor made by Microchemistry, and a layer of $ZrO_2$ was deposited to a thickness of 1–100 nm using the method of the present invention.

In this example, the two reactants were $Zr(NO_3)_4$ and $H_2O$. The substrate temperature was about 350° C.; and the reactants (precursor and co-reactant) and inert gas purge were pulsed into the reactor in the following sequence:

1. $Zr(NO_3)_4$—0.5 seconds
2. inert purge—2 seconds
3. $H_2O$—0.5 seconds
4. inert purge—2 seconds A complete series of the above steps, i.e. 1–4, is called a cycle; the completion of one cycle results in the deposition of about 0.1 to about 1 monolayer of $ZrO_2$, or roughly 0.03 nm of oxide. In this example, the preferred thickness of deposited $ZrO_2$ is 10 nm, so 333 cycles of gas switching as described above were performed. As is known to one skilled in the art, any desired thickness of $ZrO_2$ may be deposited to form the FET gate dielectric, and the number of cycles of gas switching can be adjusted to deposit the desired film thickness.

EXAMPLE 2

In this example, the inventive method is employed in forming a bilayer of $ZrO_2$ and $HfO_2$ film for use as a gate dielectric of a transistor. Specifically, a Si wafer substrate containing a patterned structure was used. Selected regions of the substrate contain shallow trench isolation (STI) oxide, other regions contain field oxide resins, and selected regions of bare Si are exposed in the regions where the FETs are to be located.

The substrate was then placed in a commercial F-200 reactor made by Microchemistry, and a layer of $ZrO_2$ was deposited to a thicknesss of from about 0.1 to about 10 nm using the ALD process of this invention. $HfO_2$ was then deposited to a thickness of from about 0.1 to about 10 nm also using the process of the present invention. This process may be repeated to deposit a layered dielectric.

In the $ZrO_2$ deposition, the substrate temperature was about 350° C. The reactants and inert purge gas were pulsed into the reactor in the following sequence:

1. $Zr(NO_3)_4$
2. inert purge
3. $H_2O$
4. inert purge

The reactant pulses (1 and 3) were about 0.5 seconds. The inert gas pulses (2–4) were about 2 seconds. In this example, the desired thickness of deposited $ZrO_2$ was 5 nm, so 167 cycles of gas switching as described above were performed.

In the $HfO_2$ deposition, the substrate temperature was about 300° C. The reactants and inert purge gas were pulsed into the reactor in the following sequence:

1. $Hf(NO_3)_4$
2. inert purge
3. $H_2O$
4. inert purge

The reactant pulses (1 and 3) were about 0.5 seconds. The inert gas pulses (2–4) were about 2 seconds. In this example, the desired thickness of deposited $HfO_2$ was 5 nm, so 167 cycles of gas switching as described above were performed.

The inventive method described in this example can be expanded to include growth of any multilayer metal oxide film consisting of alternating metal oxide layers deposited by ALD with a nitrate-containing precursor.

The inventive method described in this example can be expanded to include growth of any multilayer metal oxide film consisting of alternating metal oxide layers deposited by ALD where at least one of the metal precursors is a metal nitrate-containing precursor.

EXAMPLE 3

In this example, a Si substrate was placed in a commercial F-200 reactor made by Microchemistry, and multicomponent $ZrHfO_2$ layer was deposited using the process of the present invention. The multicomponent metal oxide film can be used as the gate dielectric layer insulator in a transistor or a capacitor.

Specifically, the two precursors used in this example were zirconium nitrate ($Zr(NO_3)_4$) and hafnium nitrate ($Hf(NO_3)_4$) and the co-reactant gas was water (oxidant). The substrate temperature was about 300° C., and the following pulse sequence was used in forming the multicomponent metal oxide:

1. $Hf(NO_3)_4$
2. inert purge
3. $H_2O$
4. inert purge
5. $Zr(NO_3)_4$
6. inert gas
7. $H_2O$
8. inert purge The reactant and precursor pulses (steps 1, 3, 5 and 7) were about 0.5 seconds; and each inert gas purge pulses was about 2 seconds. In this example, the desired thickness of deposited ZrHf oxide was 50 nm, so 500 cycles of gas switching as described above were preformed.

The inventive method described in this example can be expanded to include growth of any multicomponent metal oxide film consisting of alternating metal oxide layers deposited by ALD with a nitrate-containing precursor. Preferred multicomponent metal oxide would be pervoskite type oxide having the formula $ABO_3$ wherein B is at least one acid oxide containing a metal selected from the group consisting of Al, Ti, Zr, Hf, V, Nb, Ta, Cr, Mo, W and Cu, and A is at least one additional cation having a positive formal charge of from about 1 to about 3. Examples include pervoskite type oxides selected from: a titanate system material such as barium titanate, strontium titanate, barium strontium titanate, lead titanate, lead zirconate titanate, lead lanthanum zirconate titanate, barium lanthanum titanate, a niobate or tantalate system material such as lead magnesium niobate, lithium niobate, lithium tantalate, potassium niobate and potassium tantalum niobate, a tungsten-bronze system material such as barium strontium niobate, lead barium niobate, barium titanium niobate or a Bi-layered pervoskite system material such as strontium bismuth tantalate and bismuth titanate. Zirconate, hafnate, or alumnate systems such as yttrium alumnate, lanthanum alumnate may also be formed using the ALD method of the present invention. Other preferred multicomponent metal oxides are silicon containing oxides including hafnium silicate, zirconium silicate, alumnosilicates including rare earth doped silicates.

The inventive method described in this example can be expanded to include growth of any multicomponent metal oxide film consisting of alternating metal oxide layers deposited by ALD where at least one of the metal precursors is a metal nitrate-containing precursor.

EXAMPLE 4

In this example, the inventive method was used in forming the gate dielectric of FETs. The gate dielectric of this example consists of a deposited $SiO_2$ layer and a deposited metal oxide layer. Specifically, a Si wafer substrate containing patterned structures was used, and a F-200 reactor from Microchemistry was employed to deposit the $SiO_2$ layer and then the metal oxide layer.

The substrate was held at 500° C. while an $SiO_2$ layer (thickness from about 0.3 to about 0.5 nm) was first deposited, and a layer $HfO_2$ was then deposited at temperature of 350° C., to a thickness of about 10 nm using the process of the present invention.

In the $SiO_2$ deposition, the Si precursor was trimethylsilyl nitrate ($Si(CH_3)_3(NO_3)$) and the co-reactant was water. The different gases are pulsed in the reactor in the following sequence:

1. $Si(CH_3)_3(NO_3)$
2. inert purge
3. $H_2O$
4. inert purge

Reactant pulses (steps 1 and 3) were about 0.5 seconds each; and the inert gas purge pulses were about 2 seconds in duration. The desired thickness of $SiO_2$ was 0.2 nm; thus 7 cycles of gas switching as described above were performed.

In the $HfO_2$ deposition, the substrate temperature was about 300° C. and the precursor, co-reactant and inert purge gas were pulsed into the reactor in the following sequence:

1. $Hf(NO_3)_4$
2. inert purge
3. $H_2O$
4. inert purge

The pulse duration for steps 1 and 3 was about 0.5 seconds each, while the pulse duration for the inert gas purge was about 2 seconds. In this example, the desired thickness of the $HfO_2$ layer was 5 nm, so 167 cycles (repeating steps 1–4) of gas switching as described above were employed in depositing the metal oxide film.

EXAMPLE 5

Figure 1B:
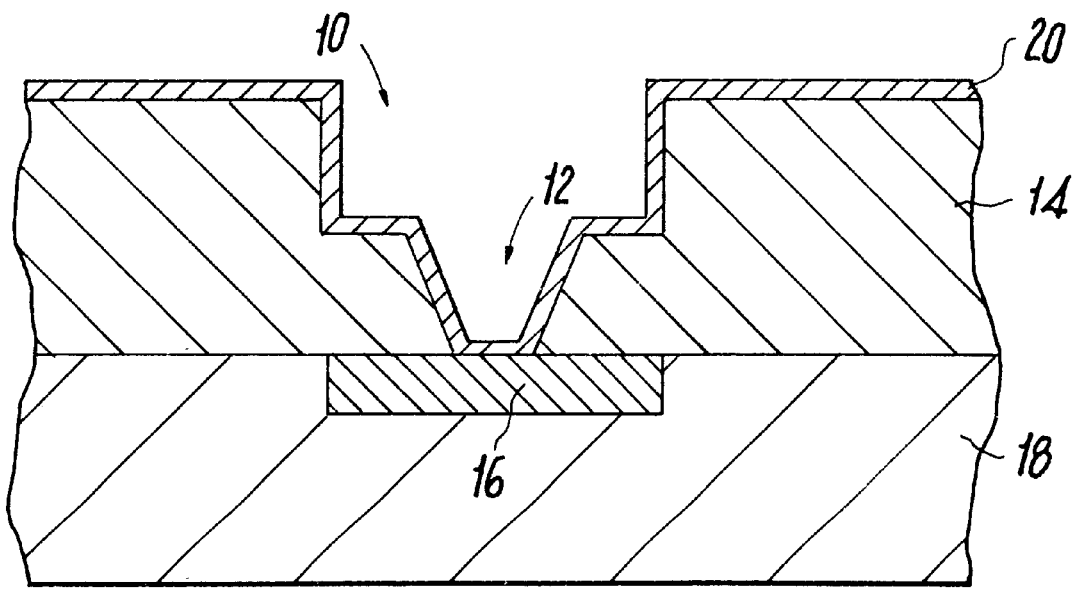

In this example, a thin film wiring structure was fabricated and the process of the present invention was used to deposit a metal nitride barrier layer that conformally coats the etched features of a dual damascene structure. FIG. 1A shows trenches 10 and vias 12 etched into a dielectric layer 14. Below dielectric layer 14 is a metal thin film wire 16 and a dielectric layer 18 of a wiring layer. The process of the present invention was used, as described below, and the resultant structure is shown in FIG. 1B—this structure includes a conformal metal nitride layer 20.

The substrate containing the dual damascene structure illustrated in FIG. 1A was placed in an ALD reactor. The barrier film in this example is TiN. The precursor was $Ti(NO_3)_4$; the substrate temperature was 300° C.; and the following pulse sequence was used:

1. $Ti(No_3)_4$—0.5 seconds
2. inert purge—2 seconds
3. $NH_3$—0.5 seconds
4. inert purge—2 seconds 167 cycles of the above pulse sequence were used in forming a TiN layer having a thickness of 5 nm.

The inventive method described in this example can be expanded to include growth of any nitride film deposited by ALD with a nitrate containing precursor, including, for example, TaN or WN from $Ta(NO_3)_5$ or $W(NO_3)_6$, respectively.

EXAMPLE 6

In the example, a sapphire substrate was placed into an ALD reactor (F-200 reactor made by Microchemistry) and a layer of GaN was deposited using the method of the present invention.

The precursor used in this example was gallium nitrate and the reactant was $NH_3$. The substrate temperature was 500° C. and the following pulse sequence was used in forming the GaN layer:

1. $NH_3$—0.5 seconds
2. inert purge—2 seconds
3. gallium nitrate—0.5 seconds
4. inert purge—2 seconds In this example, the desired thickness was 100 nm, so 2000 cycles of gas switching, as described above, were performed. Any desired thickness of GaN may be obtained by adjusting the number of gas switching cycles.

EXAMPLE 7

In this example, a metal film (Cr) was deposited. The substrate to be coated with Cr was placed in a F-200 reactor made by Microchemistry and a layer of Cr metal was deposited using the method of the present.

The substrate temperature was about 400° C. and the following pulse sequence was used in depositing the Cr metal on the substrate:

1. hydrogen—0.5 seconds
2. inert purge—2 seconds
3. chromium oxo-nitrate—0.5 seconds
4. inert purge—2 seconds.

2000 cycles of the above gas switching were used in forming a Cr metal film having a thickness of 80 nm.

EXAMPLE 8

In this example, a Si substrate was placed in an ALD reactor (F-200 reactor made by Microchemistry) and a multilayer structure consisting of Mn,Fe/Al$_2$O$_3$/Co was deposited using the process of the present invention. The resultant structure containing the multilayered film can be used for a magRAM or magnetic tunnel barrier applications.

In the first layer, the two precursors were manganese and iron nitrate and the reductant was hydrogen. The substrate temperature was 500° C. and the following pulse sequence was used in forming the multilayered structure:

1. hydrogen—0.5 seconds
2. inert purge—2 seconds
3. iron nitrate—0.5 seconds
4. inert purge—2 seconds
5. hydrogen—0.5 seconds
6. inert purge—2 seconds
7. manganese nitrate—0.5 second
8. inert purge—2 seconds The desired thickness of the FeMn alloy was 10 nm, thus 200 cycles were used.

In the second layer, the precursor was aluminum nitrate and the oxidant was water. The precursor, reactant and inert purge gas were pulsed using the following sequence:

1. aluminum nitrate—0.5 seconds
2. inert purge—2 seconds
3. water—0.5 seconds
4. inert purge—2 seconds 20 cycles were used in providing an aluminum oxide film having a thickness of 2 nm.

The third layer was formed using cobalt nitrate as the precursor and hydrogen gas as the reductant. The substrate temperature was about 500° C. and the following pulse sequence was used in forming the third layer:

1. cobalt nitrate—0.5 seconds
2. inert purge—2 seconds
3. hydrogen—0.5 seconds
4. inert purge—2 seconds.

200 gas switching cycles were used in forming a Co layer having a thickness of about 100 nm.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the appended claims,

Having thus described our invention in detail, what we claim as new and desire to secure by the Letters Patent is:

1. A method of forming a metal-containing film on a substrate comprising an atomic layer deposition process wherein a metal nitrate-containing precursor is introduced into a reactor containing said substrate.

2. The method of claim 1 wherein said metal nitrate-containing precursor has the formula M(NO$_3$)$_x$ wherein M is a metal selected from the group consisting of Ti, Ga, Zr, Sn, Co, V, Pt, Pd, Fe, Ni, Mo, W, Ag, Au, Hf, Cr, Cu, Mn, La, Y, Al, Gd, Nd, Sm, Si, Nb, Ta, and In; and x is the valence of M.

3. The method of claim 2 wherein some, but not all, of said NO$_3$ ligands of said metal nitrate-containing precursor are replaced with a substituent R, said substituent R being selected from the group consisting of hydrogen, oxygen, oxo-nitrate, hydroxyl, aromatic, alkyl, amine, silyl, alkoxide, β-diketone and mixtures thereof.

4. The method of claim 1 wherein a co-reactant gas is employed with said metal nitrate-containing precursor, said co-reactant gas being introduced separately from said metal nitrate-containing precursor.

5. The method of claim 4 wherein said co-reactant gas is a reducing agent, an oxidizing agent or a nitriding agent.

6. The method of claim 5 wherein said reducing agent is selected from the group consisting of hydrogen, forming gas and combinations thereof.

7. The method of claim 5 wherein said oxidizing agent is selected from the group consisting of oxygen, ozone, water, hydrogen peroxide, nitrous oxide and combinations thereof.

8. The method of claim 5 wherein said nitriding agent is selected from the group consisting of ammonia, hydrazine, hydrogen azide, tertbutylamine, isopropylamine and combinations thereof.

9. The method of claim 1 wherein an inert gas is employed with said metal nitrate-containing precursor, said inert gas being introduced separately from said metal nitrate-containing precursor as a purge gas.

10. The method of claim 1 wherein said metal-containing precursor forms a metal nitride film, a metal oxide film, a metal film or any combination, multilayer or multicomponent thereof.

11. The method of claim 1 wherein one or more metal non-nitrate containing precursors is employed with said metal nitrate-containing precursor, each of said metal non-nitrate containing precursors being introduced separately from said metal nitrate-containing precursors.

12. The method of claim 11 wherein said metal non-nitrate containing precursor is selected from the group consisting of a metal alkyl, a metal alkoxide, a metal halide, a metal β-diketonate, a metal hydride, a metal silyl, a metal amide and mixtures and combinations thereof.

13. A method for forming a metal oxide film on a substrate by atomic layer deposition comprising subjecting said substrate to a sequence of alternating pulses of three or more different gases to a substrate, wherein one of said gases comprising a metal nitrate-containing precursor, another of said gases is an inert gas and another of said gases is an oxidizing agent.

14. The method of claim 13 wherein said metal nitrate-containing precursor has the formula M(NO$_3$)$_x$ wherein M is a metal selected from the group consisting of Ti, Ga, Zr, Sn, Co, V, Pt, Pd, Fe, Ni, Mo, W, Ag, Au, Hf, Cr, Cu, Mn, La, Y, Al, Gd, Nd, Sm, Si, Nb, Ta, and In; and x is the valence of M.

15. The method of claim 14 wherein some, but not all, of said $NO_3$ ligands of said metal nitrate-containing precursor are replaced with a substituent R, said substituent R being selected from the group consisting of hydrogen, oxygen, oxo-nitrate, hydroxyl, aromatic, alkyl, amine, silyl, alkoxide, β-diketone and combinations thereof.

16. The method of claim 13 wherein said oxidizing agent is selected from the group consisting of oxygen, ozone, water, hydrogen peroxide, nitrous oxide and combinations thereof.

17. The method of claim 13 wherein two or more of said metal nitrate-containing precursors are employed.

18. A method of forming a metal film on a substrate by atomic layer deposition comprising subjecting said substrate to alternating pulses of a metal nitrate-containing precursor, a purge gas and a reducing agent.

19. The method of claim 18 wherein said metal nitrate-containing precursor has the formula $M(NO_3)_x$ wherein M is a metal selected from the group consisting of Ti, Ga, Zr, Sn, Co, V, Pt, Pd, Fe, Ni, Mo, W, Ag, Au, Hf, Cr, Cu, Mn, La, Y, Al, Gd, Nd, Sm, Si, Nb, Ta, and In; and x is the valence of M.

20. The method of claim 19 wherein some, but not all, of said $NO_3$ ligands of said metal nitrate-containing precursor are replaced with a substituent R, said substituent R being selected from the group consisting of hydrogen, oxygen, oxo-nitrate, hydroxyl, aromatic, alkyl, amine, silyl, alkoxide, β-diketone and mixtures thereof.

21. The method of claim 18 wherein said reducing agent is selected from the group consisting of hydrogen, forming gas and combinations thereof.

22. The method of claim 18 wherein two or more metal nitrate-containing precursors are employed.

23. A method of forming a metal nitride film on a substrate by atomic layer deposition said method comprising subjecting said substrate to alternating pulses of a metal nitrate-containing precursor, a purge gas and a nitriding agent.

24. The method of claim 23 herein said metal nitrate-containing precursor has the formula $M(NO_3)_x$ wherein M is a metal selected from the group consisting of Ti, Ga, Zr, Sn, Co, V, Pt, Pd, Fe, Ni, Mo, W, Ag, Au, Hf, Cr, Cu, Mn, La, Y, Al, Gd, Nd, Sm, Si, Nb, Ta, and In; and x is the valence of M.

25. The method of claim 24 wherein some, but not all, of said $NO_3$ ligands of said metal nitrate-containing precursor are replaced with a substituent R, said substituent R being selected from the group consisting of hydrogen, oxygen, oxo-nitrate, hydroxyl, aromatic, alkyl, amine, silyl, alkoxide, β-diketone and mixtures thereof.

26. The method of claim 23 wherein said nitriding agent is selected from the group consisting of ammonia, hydrazine, hydrogen azide, tertbutylamine, isopropylamine and combinations thereof.

27. The method of claim 23 wherein two or more metal nitrate-containing precursors.

28. In an atomic layer deposition process for forming a metal-containing film, the improvement comprising at least a step of introducing a metal-containing precursor into a reactor containing a substrate, said metal containing precursor having the formula $M(NO_3)_x$ wherein M is a metal selected from the group consisting of Ti, Ga, Zr, Sn, Co, V, Pt, Pd, Fe, Ni, Mo, W, Ag, Au, Hf, Cr, Cu, Mn, La, Y, Al, Gd, Nd, Sm, Si, Nb, Ta, and In; and x is the valence of M.

29. The method of claim 28 wherein some, but not all, of said $NO_3$ ligands of said metal nitrate-containing precursor are replaced with a substituent R, said substituent R being selected from the group consisting of hydrogen, oxygen, oxo-nitrate, hydroxyl, aromatic, alkyl, amine, silyl, alkoxide, β-diketone and mixtures thereof.

30. The method of claim 28 wherein a co-reactant gas is employed with said metal nitrate-containing precursor, said co-reactant gas being introduced separately from said metal nitrate precursor.

31. The method of claim 30 wherein said co-reactant gas is a reducing agent, an oxidizing agent or a nitriding agent.

32. The method of claim 31 wherein said reducing agent is selected from the group consisting of hydrogen, forming gas and combinations thereof.

33. The method of claim 31 wherein said oxidizing agent is selected from the group consisting of oxygen, ozone, water, hydrogen peroxide, nitrous oxide and combinations thereof.

34. The method of claim 31 wherein said nitriding agent is selected from the group consisting of ammonia, hydrazine, hydrogen azide, tertbutylamine, isopropylamine and combinations thereof.

35. The method of claim 28 wherein an inert gas is employed with said metal nitrate-containing precursor, said inert gas being introduced separately from said metal nitrate-containing precursor.

36. A method for forming a multicomponent or multilayer metal oxide film on a substrate by atomic layer deposition comprising subjecting said substrate to a sequence of alternating pulses of four or more different gases, wherein one of said gases comprises a metal nitrate-containing precursor, another of said gases is an inert gas, another of said gases is an oxidizing agent and another of said gases is a metal non-nitrate containing precursor.

37. The method of claim 36 wherein said metal nitrate-containing precursor has the formula $M(NO_3)_x$ wherein M is a metal selected from the group consisting of Ti, Ga, Zr, Sn, Co, V, Pt, Pd, Fe, Ni, Mo, W, Ag, Au, Hf, Cr, Cu, Mn, La, Y, Al, Gd, Nd, Sm, Si, Nb, Ta, and In; and x is the valence of M.

38. The method of claim 37 wherein some, but not all, of said $NO_3$ ligands of said metal nitrate-containing precursor are replaced with a substituent R, said substituent R being selected from the group consisting of hydrogen, oxygen, oxo-nitrate, hydroxyl, aromatic, alkyl, amine, silyl, alkoxide, β-diketone and combinations thereof.

39. The method of claim 36 wherein said oxidizing agent is selected from the group consisting of oxygen, ozone, water, hydrogen peroxide, nitrous oxide and combinations thereof.

40. The method of claim 36 wherein two or more of said metal nitrate-containing precursors are employed.

41. The method of claim 36 wherein said metal non-nitrate containing precursor is selected from the group consisting of a metal alkyl, a metal alkoxide, a metal halide, a metal β-diketonate, a metal hydride, a metal silyl, a metal amide and mixtures and combinations thereof.

42. A method for forming a multicomponent or multilayer metal film on a substrate by atomic layer deposition comprising subjecting said substrate to a sequence of alternating pulses of four or more different gases, wherein one of said gases comprises a metal nitrate-containing precursor, another of said gases is an inert gas, another of said gases is a reducing agent and another of said gases is a metal non-nitrate containing precursor.

43. The method of claim 42 wherein said metal nitrate-containing precursor has the formula $M(NO_3)_x$ wherein M is a metal selected from the group consisting of Ti, Ga, Zr, Sn, Co, V, Pt, Pd, Fe, Ni, Mo, W, Ag, Au, Hf, Cr, Cu, Mn, La, Y, Al, Gd, Nd, Sm, Si, Nb, Ta, and In; and x is the valence of M.

44. The method of claim 43 wherein some, but not all, of said $NO_3$ ligands of said metal nitrate-containing precursor are replaced with a substituent R, said substituent R being selected from the group consisting of hydrogen, oxygen, oxo-nitrate, hydroxyl, aromatic, alkyl, amine, silyl, alkoxide, β-diketone and combinations thereof.

45. The method of claim 42 wherein said reducing agent is selected from the group consisting of hydrogen, forming gas and combinations thereof.

46. The method of claim 42 wherein two or more of said metal nitrate-containing precursors are employed.

47. The method of claim 42 wherein said metal non-nitrate containing precursor is selected from the group consisting of a metal alkyl, a metal alkoxide, a metal halide, a metal β-diketonate, a metal hydride, a metal silyl, a metal amide and mixtures and combinations thereof.

48. A method for forming a multicomponent or multilayer metal nitride film on a substrate by atomic layer deposition comprising subjecting said substrate to a sequence of alternating pulses of four or more different gases, wherein one of said gases comprises a metal nitrate-containing precursor, another of said gases is an inert gas, another of said gases is a nitriding agent and another of said gases is a metal non-nitrate containing precursor.

49. The method of claim 48 wherein said metal nitrate-containing precursor has the formula $M(NO_3)_x$ wherein M is a metal selected from the group consisting of Ti, Ga, Zr, Sn, Co, V, Pt, Pd, Fe, Ni, Mo, W, Ag, Au, Hf, Cr, Cu, Mn, La, Y, Al, Gd, Nd, Sm, Si, Nb, Ta, and In; and x is the valence of M.

50. The method of claim 49 wherein some, but not all, of said $NO_3$ ligands of said metal nitrate-containing precursor are replaced with a substituent R, said substituent R being selected from the group consisting of hydrogen, oxygen, oxo-nitrate, hydroxyl, aromatic, alkyl, amine, silyl, alkoxide, β-diketone and combinations thereof.

51. The method of claim 48 wherein said nitriding agent is selected from the group consisting of ammonia, hydrazine, hydrogen azide, tertbutylamine, isopropylamine and combinations thereof.

52. The method of claim 48 wherein two or more of said metal nitrate-containing precursors are employed.

53. The method of claim 48 wherein said metal non-nitrate containing precursor is selected from the group consisting of a metal alkyl, a metal alkoxide, a metal halide, a metal β-diketonate, a metal hydride, a metal silyl, a metal amide and mixtures and combinations thereof.

* * * * *